United States Patent
Hsu et al.

(10) Patent No.: US 7,483,299 B2
(45) Date of Patent: Jan. 27, 2009

(54) DEVICES AND OPERATION METHODS FOR REDUCING SECOND BIT EFFECT IN MEMORY DEVICE

(75) Inventors: Tzu-Hsuan Hsu, Jhongpu Township, Chiayi County (TW); Chao-I Wu, Zhubei (TW); Erh-Kun Lai, Taichung County (TW)

(73) Assignee: Macronix International Co., Ltd., Hsinchu (TW)

( * ) Notice: Subject to any disclaimer, the term of this patent is extended or adjusted under 35 U.S.C. 154(b) by 247 days.

(21) Appl. No.: 11/496,441

(22) Filed: Aug. 1, 2006

(65) Prior Publication Data

US 2008/0031039 A1 Feb. 7, 2008

(51) Int. Cl.
*G11C 11/03* (2006.01)
(52) U.S. Cl. .............................. 365/185.1; 365/185.18; 365/185.26; 365/185.27
(58) Field of Classification Search ............. 365/185.1, 365/185.27, 185.26, 185.18
See application file for complete search history.

(56) References Cited

U.S. PATENT DOCUMENTS

| 6,011,725 | A | 1/2000 | Eitan | |
|---|---|---|---|---|
| 6,288,943 | B1 * | 9/2001 | Chi | ....................... 365/185.18 |
| 6,320,786 | B1 | 11/2001 | Chang et al. | |
| 6,487,114 | B2 | 11/2002 | Jong et al. | |
| 6,721,204 | B1 * | 4/2004 | Yeh et al. | ................ 365/185.24 |
| 2003/0185052 | A1 * | 10/2003 | Yeh et al. | ................ 365/185.18 |
| 2006/0197139 | A1 * | 9/2006 | Wu et al. | ..................... 257/315 |

* cited by examiner

*Primary Examiner*—Pho M. Luu
(74) *Attorney, Agent, or Firm*—Finnegan Henderson Farabow Garrett & Dunner LLP

(57) ABSTRACT

A method for operating a semiconductor memory device having first and second bit lines, a gate electrode, an insulative layer, and a substrate includes applying first, second, and third biases to the first bit line, the second bit line, and the gate electrode, respectively, to induce carriers from the gate electrode to the insulative layer, where the carriers have the same type of conductivity as majority carriers in the substrate to thereby reduce a threshold voltage of the semiconductor memory device.

24 Claims, 14 Drawing Sheets

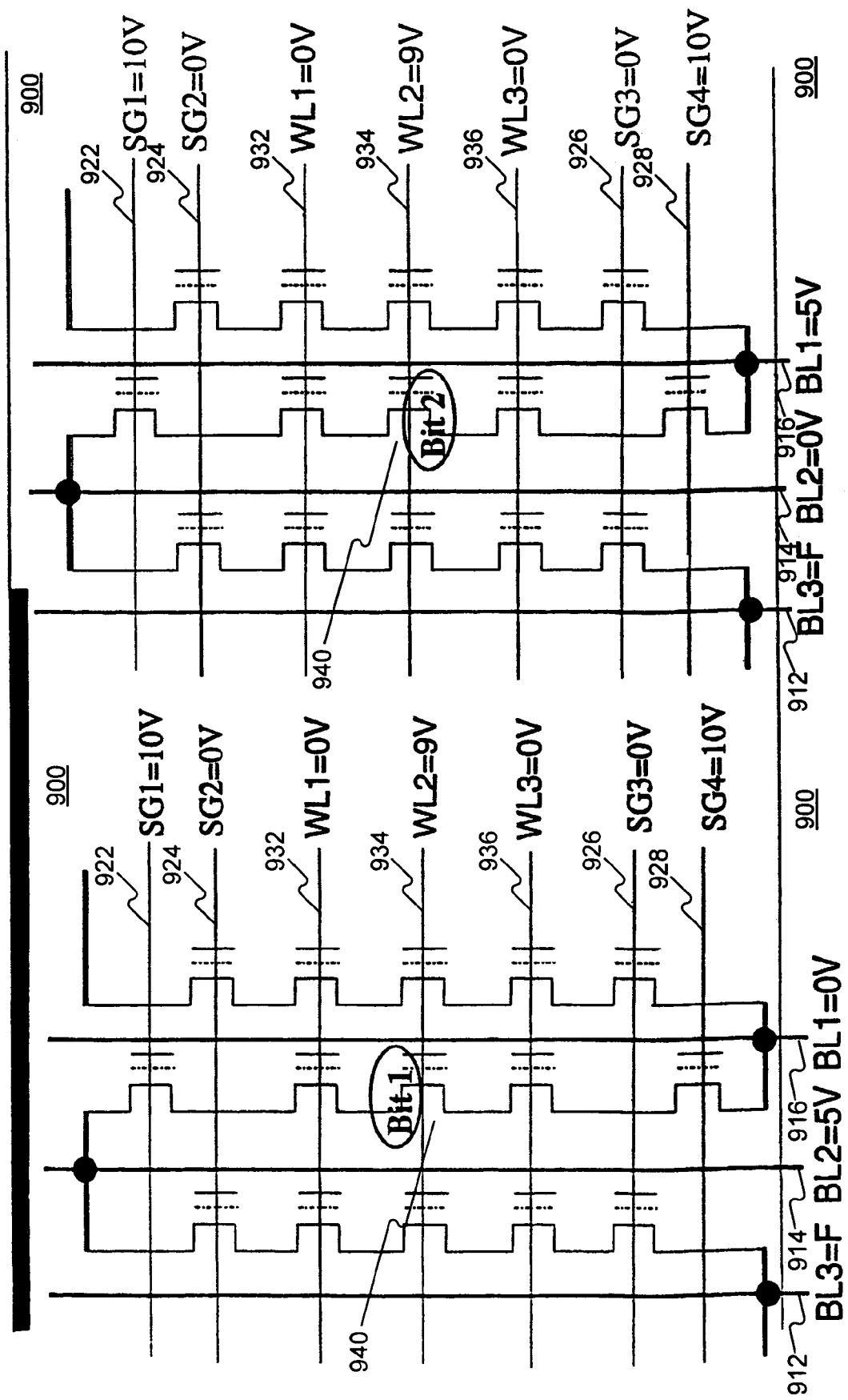

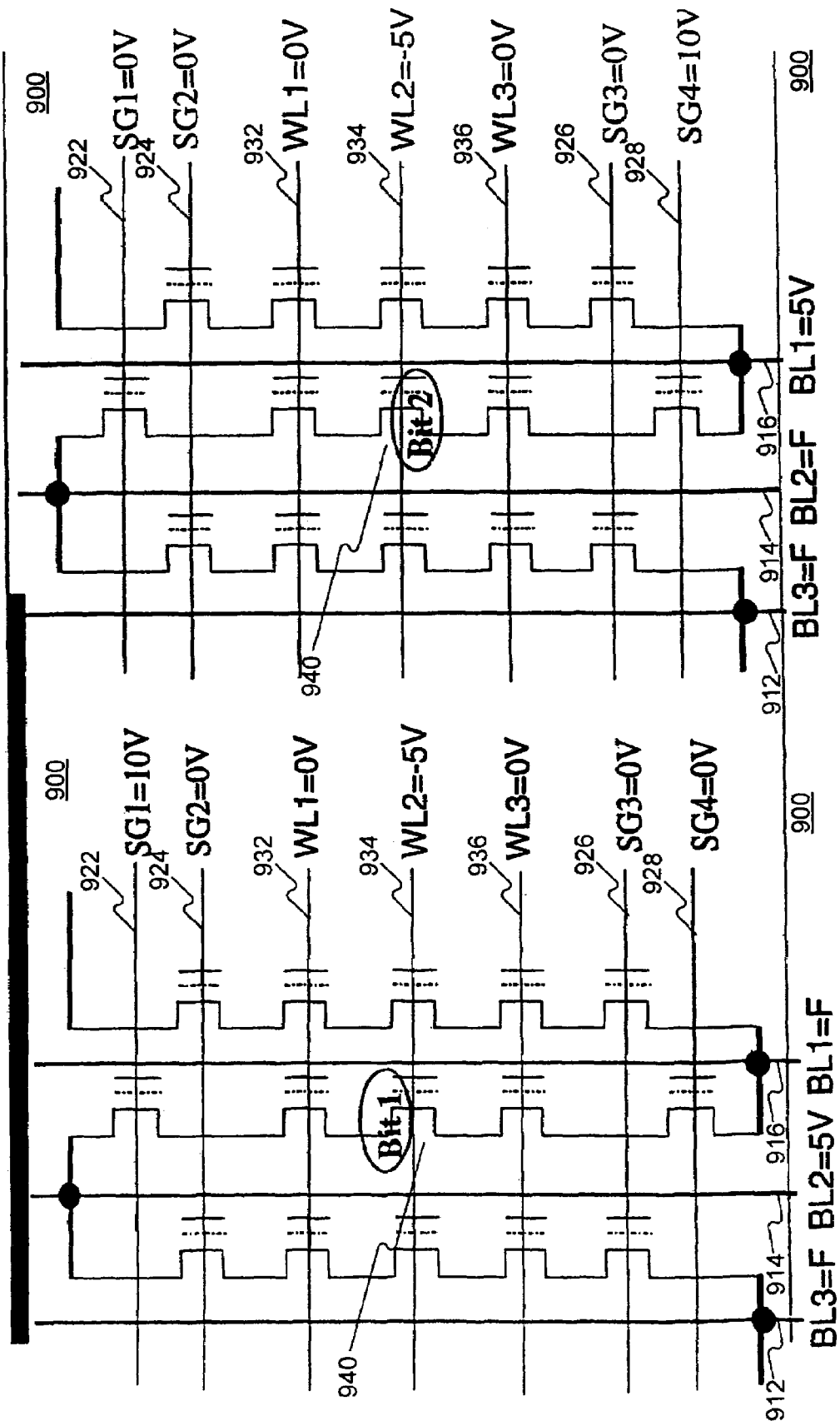

DEVICES AND OPERATION METHODS FOR REDUCING SECOND BIT EFFECT IN MEMORY DEVICE

TECHNICAL FIELD

The present invention relates generally to methods and devices for reducing the second bit effect in memory cell devices.

BACKGROUND

A flash memory device is a non-volatile semiconductor memory device, which retains its memory contents even if it is powered off. Flash memory devices offer fast read access time and better shock resistance compared to hard disks. As a result, flash memory devices are popular for applications, such as storage on battery-powered devices, and are extensively used in consumer electronic products.

In certain flash memory devices, one bit of information is stored in each memory cell. More recently, flash memory devices have been developed to store more than one bit per cell. Such devices are often referred to as "multi-level cell" devices. Such multi-level cell devices, such as Nitride Read Only Memory (NROM) devices, include a nitride storage material.

A single NROM cell typically includes a nitride trapping layer overlying a channel region provided between source and drain regions. The NROM cell can be programmed to store two physically separated bits in the nitride trapping layer, in the form of a concentration of charge near the source region and another concentration of charge near the drain region. Programming of the NROM cell can be performed by Channel Hot Electron (CHE) injection, which generates hot electrons in the channel region. Some of these hot electrons gain enough energy to become trapped in the nitride trapping layer. By interchanging the biases applied to the source and drain terminals, the charge is trapped either in a portion of the nitride trapping layer near the source region, near the drain region, or both.

Accordingly, for example, if no charge is stored in the memory cell, the threshold voltage of the memory cell has a minimal value corresponding to a combination of bits 0 and 0. If charge is stored in the nitride trapping layer near the source region, but not near the drain region, the threshold voltage has a different value corresponding to a combination of bits 1 and 0, for example. The threshold voltage has yet another value if charge is stored near the drain region but not near the source region. In that case, the threshold voltage corresponds to a combination of bits 0 and 1. Lastly, if charge is stored near both the source and the drain region, the threshold voltage is at its highest, and corresponds to a combination of bits 1 and 1. Thus, four distinct combination of bits 00, 01, 10 and 11 can be stored, and each combination has a corresponding threshold voltage. During a read operation, current flowing through the memory cell will vary depending upon the threshold voltage of the cell. Typically, such current will have four different values, each corresponding to a different threshold voltage. Accordingly, by sensing such current, the particular bit combination stored in the cell can be determined.

The total available charge range or the threshold voltage range may be referred to as memory operation window. In other words, memory operation window is defined by the difference between program level and erase level. A large memory operation window is desirable because good level separation between states is needed for multi-level cell operation The performance of two-bit memory cells, however, is often degraded by the so-called "second bit effect" in which localized charges in the trapping layer interact with each other. For example, during a reverse read operation, a read bias is applied to the drain terminal and the charge stored near the source region (i.e., a "first bit") is sensed. The charge near the drain region (i.e., the "second bit"), however, creates a potential barrier for reading the first bit near the source region. This barrier may be overcome by applying a bias with a suitable magnitude, using the drain-induced barrier lowering (DIBL) effect to suppress the effect of the second bit near the drain region and allow the sensing of the storage status of the first bit. However, when the second bit near the drain region is programmed to a high threshold voltage state and the first bit near the source region is programmed to a low threshold voltage state, the second bit raises this barrier substantially. Therefore, as the threshold voltage associated with the second bit increases, the read bias for the first bit becomes insufficient to overcome the potential barrier created by the second bit. As a result, the threshold voltage associated with the first bit is raised as a result of the increasing threshold voltage of the second bit, thereby reducing the memory operation window.

The second bit effect decreases the memory operation window for 2-bit/cell operation and/or multi-level cell (MLC) operation. Therefore, there is a need for methods and devices for suppressing the second bit effect in memory devices.

SUMMARY

Consistent with the present invention, semiconductor memory devices disclosed herein comprise a substrate having a first region, a second region and a channel region, and a multi-layered stack formed above the channel region. The substrate has a first conductivity type, while the first and second regions have a second conductivity type. The second region is spaced from the first region, and the channel region extends between the first and second regions. The multi-layered stack comprises, upward from bottom, a first insulative layer, a second insulative layer, a third insulative layer, a first conductive layer, a fourth insulative layer, and a second conductive layer. The first insulative layer includes a first material, while a second insulative layer includes a second material. Moreover, the second insulative layer is configured to store a first charge in a first portion corresponding to a first bit and a second charge in a second portion corresponding to a second bit.

Also consistent with the present invention, a method for operating a semiconductor memory device is provided. The semiconductor memory device includes first and second bit lines, a gate electrode, an insulative layer, and a substrate. The method includes applying first, second, and third biases to the first bit line, the second bit line, and the gate electrode, respectively, to induce carriers from the gate electrode to the insulative layer. The carriers have the same type of conductivity as majority carriers in the substrate, thereby reducing a threshold voltage of the semiconductor memory device.

Further consistent with the present invention, a semiconductor memory device is provided, which comprises a first bit line, a second bit line, a gate electrode, an insulative layer, a substrate, and first, second, and third bias circuits. The substrate has majority carriers having a conductivity. The first bias circuit is configured to apply a first bias to the first bit line, and the second bias circuit is configured to apply a second bias to the second bit line. Similarly, the third bias circuit is configured to apply a third bias to the gate electrode. Upon application of the first, second, and third biases, carriers are induced from the gate electrode into the insulative layer.

The carriers have the same conductivity as majority carriers in the substrate, thereby reducing a threshold voltage of the semiconductor memory device.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments.

FIG. 9B is an exemplary schematic view illustrating a portion of a NAND array using a CHE injection operation to program a first bit of a memory cell;

FIG. 9C is an exemplary schematic view illustrating a portion of the NAND array using a CHE injection operation to program a second bit of a memory cell;

FIG. 9D is an exemplary schematic view illustrating a portion of a NAND array using a BTBHHI operation to erase a first bit of a memory cell;

FIG. 9E is an exemplary schematic view illustrating a portion of a NAND array using a BTBHHI operation to erase a second bit of a memory cell.

DETAILED DESCRIPTION

Reference will now be made in detail to exemplary embodiments consistent with the present invention, examples of which are illustrated in the accompanying drawings. Wherever possible, the same reference numbers will be used throughout the drawings to refer to the same or like parts. While the description includes exemplary embodiments, other embodiments are possible, and changes may be made to the embodiments described without departing from the spirit and scope of the invention. The following detailed description does not limit the invention. Instead, the scope of the invention is defined by the appended claims and their equivalents.

Consistent with the present invention, a semiconductor memory device is provided, having source and drain regions, and a gate, beneath which a multilayered structure is formed. The multi-layered structure includes a layer of polysilicon sandwiched between layers of silicon oxide. In one embodiment, appropriate biases are applied to the source, drain, gate and substrate, to inject holes into a trapping layer. As a result, the initial threshold voltage associated with portions of the trapping layer adjacent the source and drain region is lowered, which minimizes any threshold voltage increase associated with the second bit effect.

Figure 1:
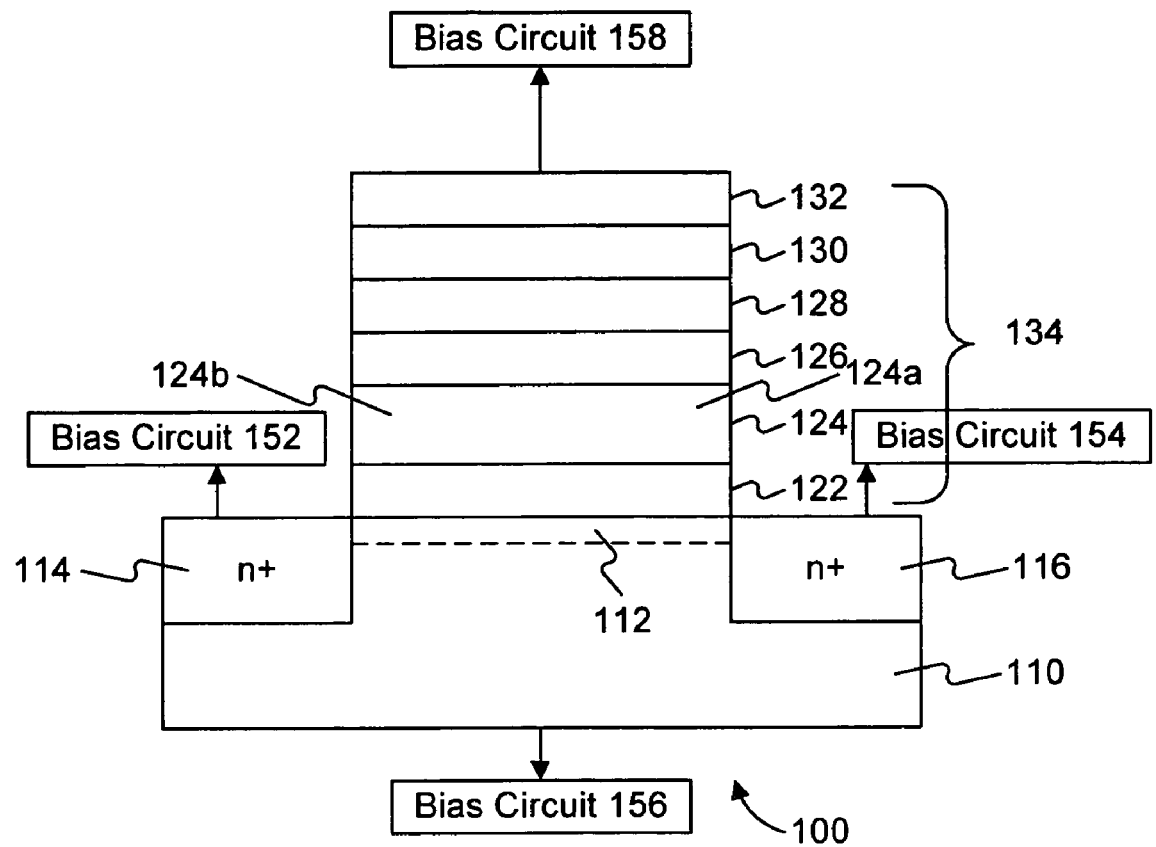
FIG. 1 is a cross-sectional view illustrating a semiconductor memory device.

FIG. 1 is a cross-sectional view illustrating a semiconductor memory device 100. The memory device 100 comprises a P-type substrate 110, a first region 114, a second region 116, and a channel region 112. In one embodiment, the first region 114 is an N-type source region and the second region 116 is an N-type drain region. In addition, a multi-layered stack 134 is provided above the channel region 112. The multi-layered stack 134 comprises, upward from bottom in FIG. 1, a first insulative layer 122, a second insulative layer 124 (trapping layer), a third insulative layer 126, a first conductive layer 128, a fourth insulative layer 130, and a second conductive layer 132. The first and third insulative layers 122 and 126 include a first material, such as an oxide, while the second insulative layer 124 includes a second material, such as a nitride. The oxide may include silicon dioxide and the nitride may include silicon nitride.

The second conductive layer 132 typically constitutes a gate electrode and may include a P-type polysilicon. One of ordinary skill in the art will recognize that, consistent with embodiments of the present invention, the second conductive layer 132 may comprise other materials, such as a N-type polysilicon or a metal. Similarly, the fourth insulative layer 130 may comprise an oxide and the first conductive layer 128 may comprise polysilicon.

In addition, first and second charges can be stored in right (124a) and left (124b) portions, respectively, of the second insulative layer 124. The first and second charges correspond to a "right bit" and a "left bit", respectively. Thus, the storage location of the right bit is near the second region 116 and the storage location of the left bit is near the first region 114.

Also in FIG. 1, biases may be applied to the first region 114, the second region 116, the second conductive layer 132, and the substrate 110 during cell operation. One of ordinary skill in the art will recognize that, consistent with embodiments of the present invention, these biases may have various magnitudes, depending on the specific cell operation. In one embodiment, a bias circuit 152 supplies a bias to the first region 114; a bias circuit 154 supplies a bias to the second region 116; a bias circuit 156 supplies a bias to the substrate 110; and a bias circuit 158 supplies a bias to the second conductive layer 132. These biases will be described in greater detail below. Bias circuits 152, 154, 156 and 158 are shown as separate circuits. It is understood, however, that bias circuits 152, 154, 156 and 158 could constitute part of a single circuit.

Figure 2:
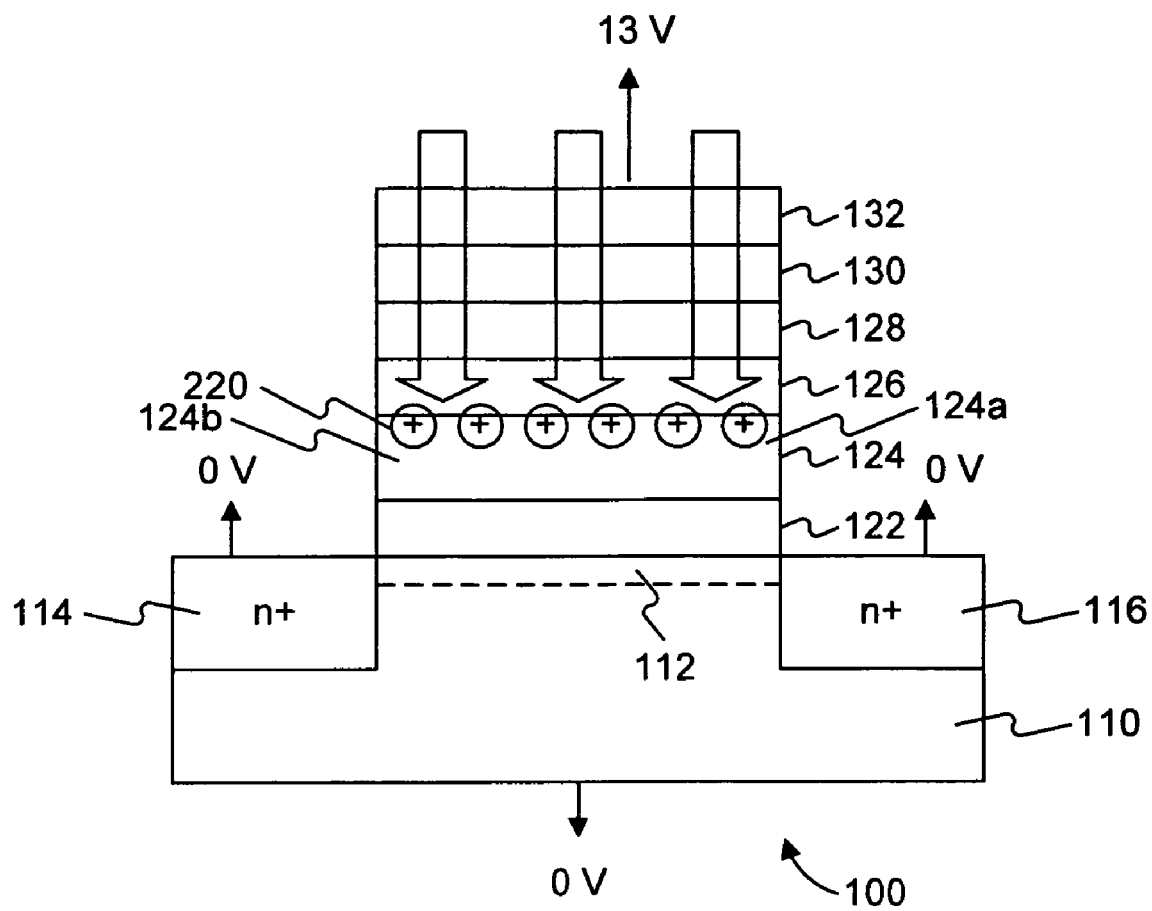
FIG. 2 illustrates a hole gate Fowler-Nordheim (FN) injection operation to form an initial threshold voltage level of the semiconductor memory device.
Figure 3A:
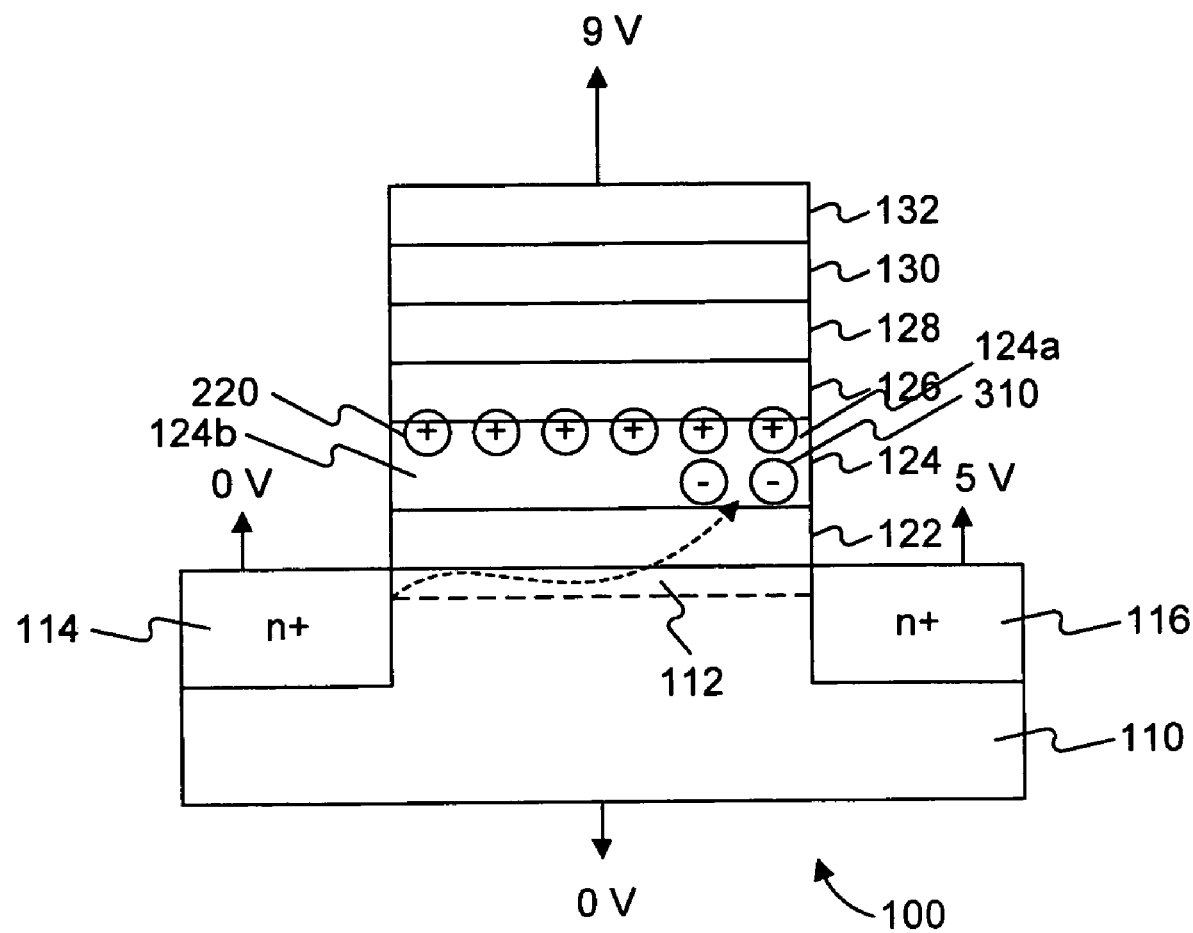
FIG. 3A illustrates a CHE injection operation to program a right bit in the trapping layer near the drain region.
Figure 3B:
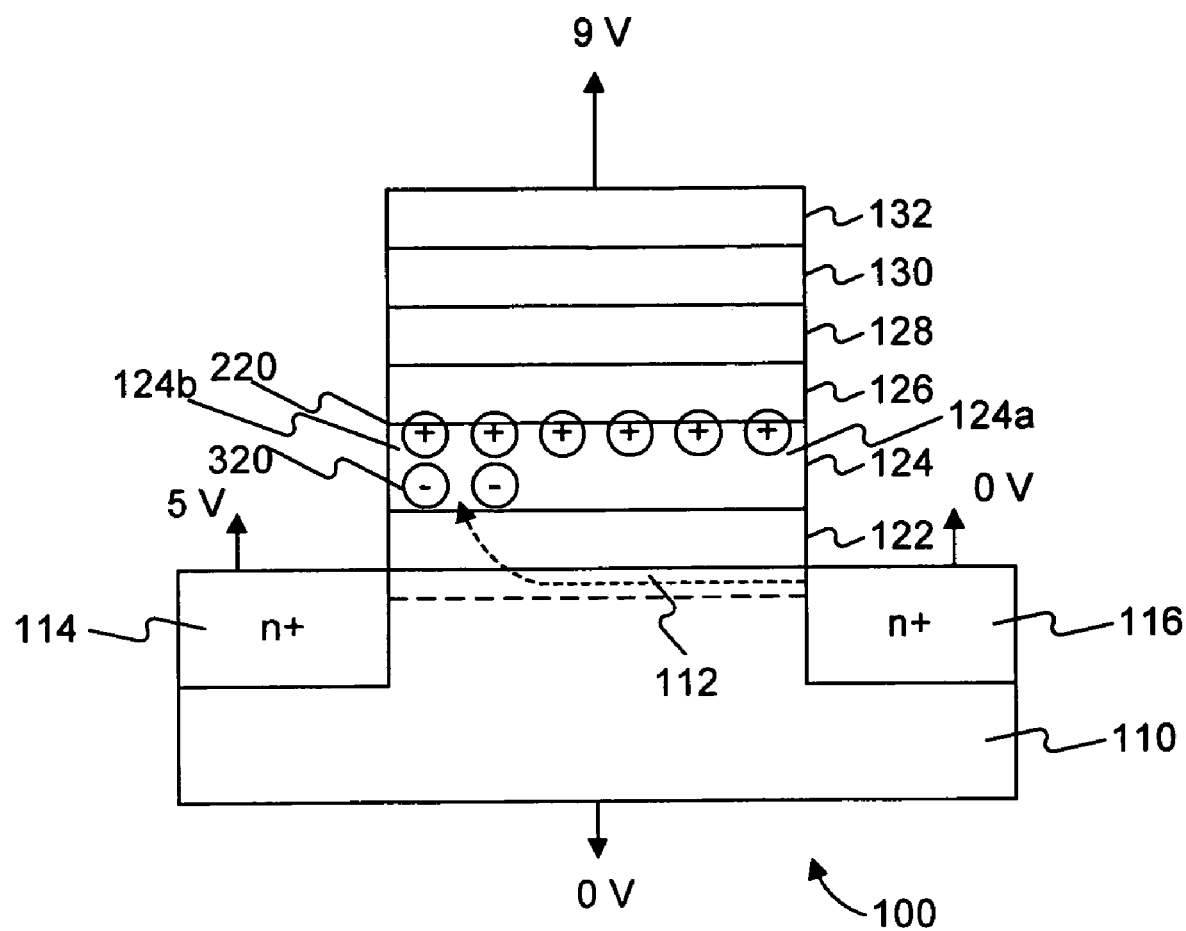
FIG. 3B illustrates a CHE injection operation to program a left bit in the trapping layer near the source region.
Figure 4A:
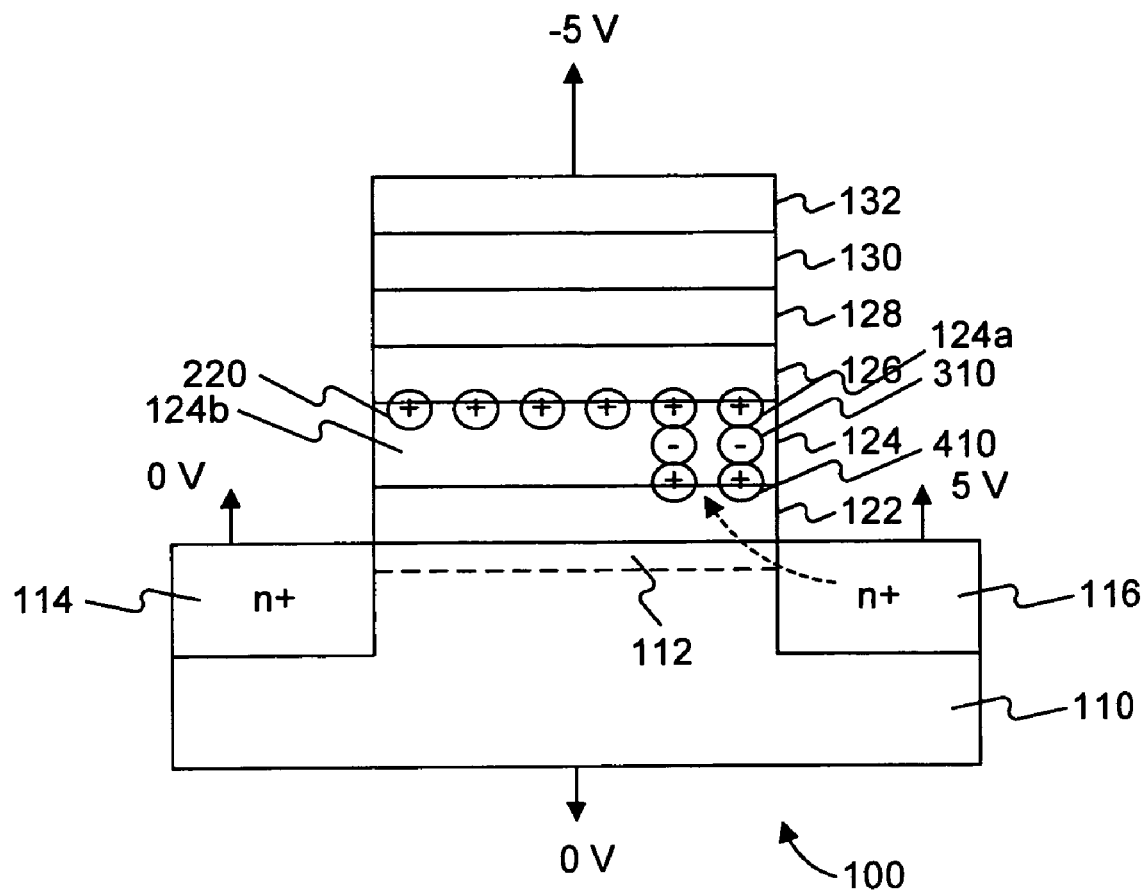
FIG. 4A illustrates a Band-To-Band Tunneling Hot-Hole Injection (BTBHHI) operation to erase the right bit in the trapping layer near the drain region.
Figure 4B:
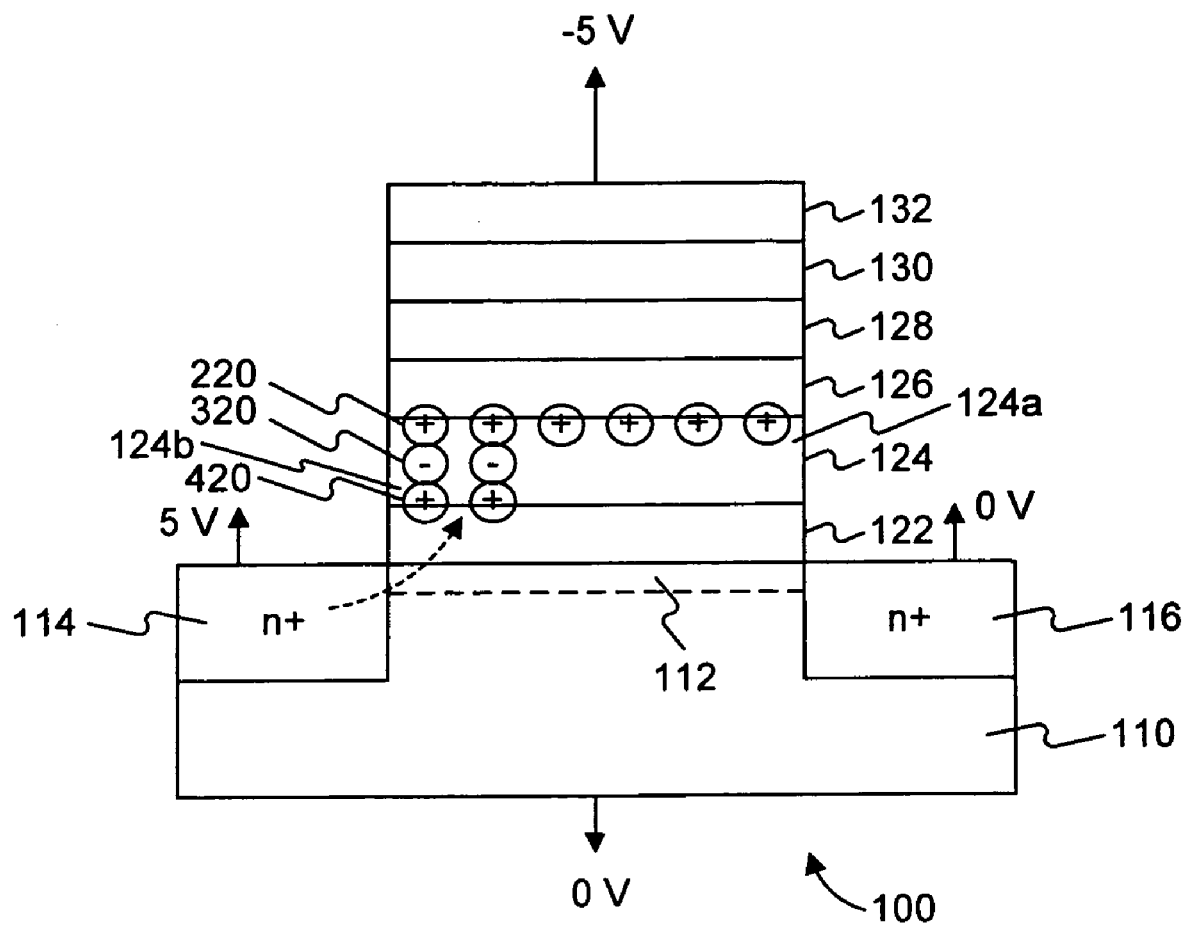
FIG. 4B illustrates a BTBHHI operation to erase the left bit in the trapping layer near the source region.
Figure 5:
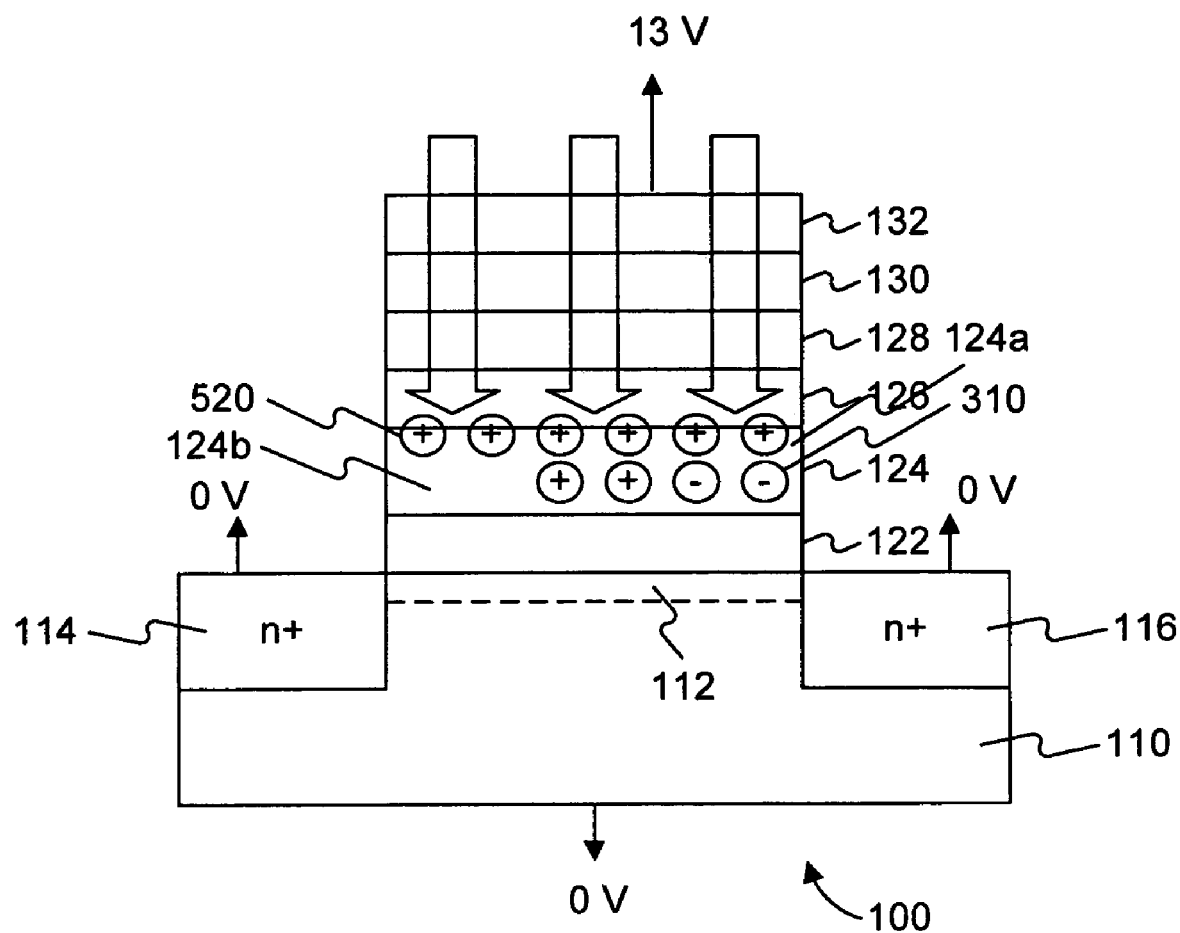
FIG. 5 illustrates a hole gate injection operation to erase or reset the memory device to an initial negative threshold voltage level.

Operation of the semiconductor memory device 100 will next be described with reference to FIGS. 2-5. FIG. 2 illustrates hole gate Fowler-Nordheim (FN) injection to set an initial threshold voltage level of the semiconductor memory device 100. Setting an initial threshold voltage level to a negative level suppresses the second bit effect and therefore increases the memory operation window. FIGS. 3A and 3B illustrate CHE injection to program a right or left bit, respectively, in the second insulative layer 124, while FIGS. 4A and 4B illustrate BTBHHI operation to erase the right or left bit, respectively, in the second insulative layer 124. In addition, FIG. 5 illustrates hole gate FN injection used to erase or reset the memory device 100 to an initial negative threshold voltage level. Hole gate FN injection provides a quick and easy way to erase all data stored in the memory device As shown in FIG. 2, a hole gate FN injection operation is used to set an initial threshold voltage level of the semiconductor memory device 100. In particular, a bias of 13 V is applied to the second conductive layer 132, a bias of 0 V is applied to the first region 114, a bias of 0 V is applied to the second region 116, and a bias of 0 V is applied to the substrate 110. Carriers, such as holes 220, are then injected through the third (126) and fourth (130) insulative layers and the first conductive layer (128) to the second insulative layer 124 to form a negative initial threshold voltage. One of ordinary skill in the art will recognize that, consistent with embodiments of the present invention, carriers, such as electrons, may also be injected into the second insulative layer 124 to set a different initial threshold voltage level. In addition, the above noted voltages are exemplary. It is understood that other voltages may be applied in order to set an initial threshold voltage level.

Next, programming will be described with reference to FIGS. 3A and 3B. FIG. 3A illustrates a CHE injection operation to store charge 310 in the right portion 124a of the second insulative layer 124 near the drain region 116. As shown in FIG. 3A, the CHE injection operation generates hot electrons in the channel region 112 of the substrate 110. The CHE injection operation is carried out by, for example, applying a bias of 9 V to the second conductive layer 132, a bias of 5 V to the drain region 116, a bias of 0 V to the source region 114, and a bias of 0 V to the substrate 110. Under these circumstances, electrons in the channel region 112 gain enough energy (i.e., such electrons become "hot") to travel through the first insulative layer 122 and become trapped in the right portion 124a of second insulative layer 124. As a result, such charge, corresponding to the right bit, is stored near the drain region 116.

In FIG. 3B, another CHE injection operation is used to store charge 320 in the left portion 124b of the second insulative layer 124 near the source region 114. This additional CHE injection operation is carried out by, for example, applying a: bias of 9 V to the second conductive layer 132, a bias of 5 V to the source region 114, a bias of 0 V to the drain region 116, and a bias of 0 V to the substrate 110. As a result, hot electrons in the channel region 112 gain enough energy to travel through the first insulative layer 122 and become trapped in the left portion 124b of-the second insulative layer 124. Accordingly, such charge remains stored in the left portion 124b of the second insulative layer 124, corresponding to the left bit.

Although CHE injection is described above as a technique for programming the memory device 100, one of ordinary skill in the art will now recognize that, consistent with embodiments of the present invention, other techniques such as Source Side Injection (SSI) may be used.

An erase operation of the memory device 100 will next be described in connection with FIGS. 4A and 4B. In FIG. 4A, a Band-To-Band Tunneling Hot-Hole Injection (BTBHHI) operation is used to erase charge 310 stored in the right portion 124a of the second insulative layer 124 near the drain region 116. By applying, for example, a bias of −5 V to the second conductive layer 132, a bias of 5 V to the drain region 116, a bias of 0 V to the source region 114, and a bias of 0 V to the substrate 110, some of the holes near the drain region 116 gain enough energy to travel through the first insulative layer 122 to the second insulative layer 124, forming a third charge 410. The third charge 410 has an opposite polarity as charge 310 in the portion 124a of the second insulative layer 124, thereby neutralizing charge 310 near the drain region 116.

Similarly, FIG. 4B illustrates a BTBHHI operation 440 to erase charge 320 stored in the left portion 124b of the second insulative layer 124 near the source region 114. By applying, for example, a bias of −5 V to the second conductive layer 132, a bias of 5 V to the source region 114, a bias of 0 V to the drain region 116, and a bias of 0 V to the substrate 110, some of the hot holes near the source region 114 gain enough energy to travel through the first insulative layer 122 to the second insulative layer 124, forming a fourth charge 420. The fourth charge 420 has an opposite polarity as charge 320, thereby neutralizing charge 320 near the source region 116.

Consistent with the embodiments of present invention, methods in addition to BTBHHI are also contemplated for erase operations. For example, FIG. 5 illustrates a hole gate injection operation to erase or reset the memory device 100 to an initial negative threshold voltage level. An advantage of the hole gate injection operation is that charge stored in the right (124a) and left (124b) portions of the second insulative layer 124 can be erased simultaneously.

The hole gate injection operation, shown in FIG. 5, will next be described in greater detail. A bias of 13 V, for example, is applied to the second conductive layer 132, a bias of 0 V to the first region 114, a bias of 0 V to the second region 116, and a bias of 0 V to the substrate 110. Carriers, such as holes 520, are then injected through the third and fourth insulative layers 126 and 130 and the first conductive layer 128 to the second insulative layer 124 to neutralize negative charges stored in the second insulative layer 124 and/or reset the threshold voltage to a negative initial threshold voltage. Consistent with embodiments of the present invention, the hole gate injection operation may be used to set the threshold voltage at different levels.

Figure 6A:
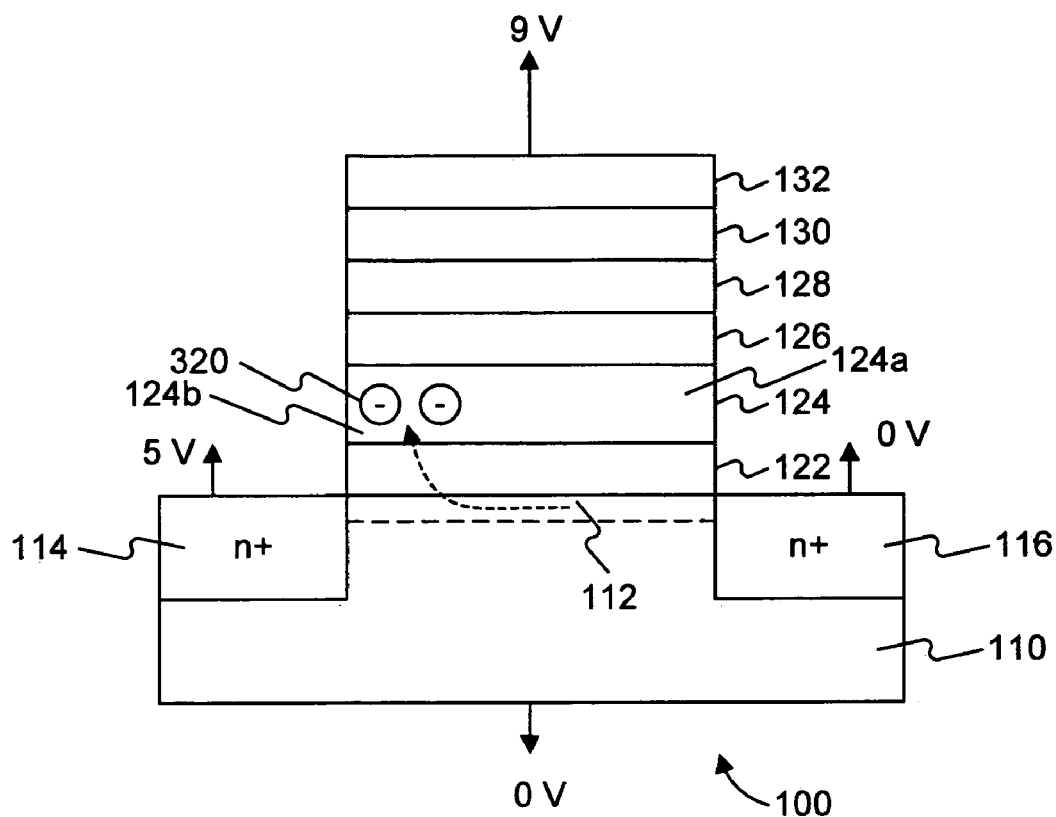
FIG. 6A illustrates a second bit effect created by a CHE injection operation to program the left bit in the trapping layer near the source region.
Figure 6B:
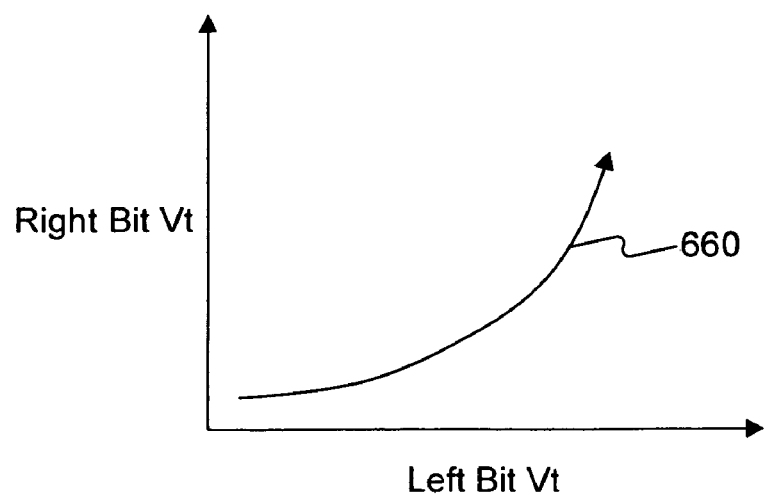
FIG. 6B illustrates a graphical representation of the second bit effect by showing a relationship between a threshold voltage associated with the right bit and a threshold voltage associated with the left bit.

FIGS. 6A and 6B illustrate how the second bit effect affects 2-bit/cell operation without a negative initial threshold voltage. FIG. 6A illustrates a CHE injection operation used to store charge 320 in the portion 124b of the second insulative layer 124. In particular, a bias of 9 V is applied to the second conductive layer 132, a bias of 5 V is applied to the source region 114, a bias of 0 V is applied to the drain region 116, and a bias of 0 V is applied to the substrate 110. As a result, charge is stored in the left portion 124b of the second insulative layer 124. Memory cell 100 is susceptible to the second bit effect. As shown in FIG. 6B, as the threshold voltage associated with the left bit is programmed to a higher value, the threshold voltage associated with the right bit also increases (see curve 660). For example, if the left bit cannot be screened effectively with a read voltage of 1.6 V, the threshold voltage associated with the right bit will increase. This second bit effect decreases the memory operation window for 2-bit/cell operation.

Figure 7:
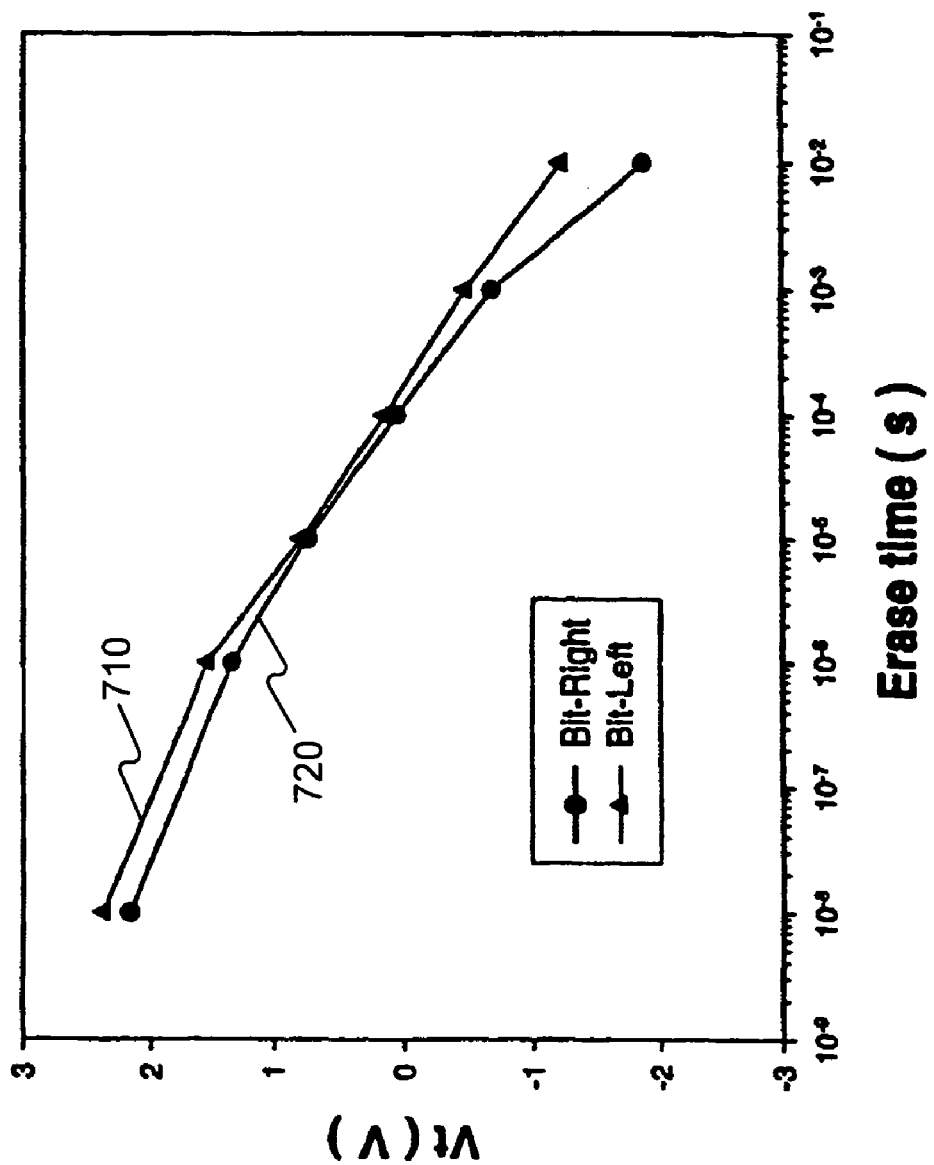
FIG. 7 illustrates a graphical representation of the relationship between the threshold voltage and the erase time for both bits using hole gate injection.

FIG. 7 illustrates a graphical representation of the relationship between the threshold voltage and the duration of the gate hole injection operation ("erase time"). In one experiment, the hole gate injection operation was carried out by applying a bias of 16 V to a gate electrode of a memory cell, a bias of 0 V to a source region, a bias of 0 V to a drain region, and a bias of 0 V to a substrate. Carriers, such as holes, were then injected from the gate electrode to a nitride trapping layer to erase the charges stored therein, as discussed above. Curve 710 represents the relationship between the threshold voltage and the erase time for the left bit using hole gate injection, while curve 720 represents the relationship between the threshold voltage and the erase time for right bit using hole gate injection.

As shown in FIG. 7, as the erase time increased, threshold voltage levels associated with the right bit and the left bit are reduced. For example, the threshold voltages associated with the right bit and the left bit were reduced from about 2 V at $10^{-8}$ second to about –2V at $10^{-2}$ second. Curves 710 and 720 follow a similar pattern, because the hole gate injection operation injects holes over the entire nitride trapping layer and thus resets the threshold voltage of the memory cell to the initial level.

The second bit effect may also be observed during the read operation of the memory cell 100, during which the threshold voltages associated with the right and left bits shift upward. The read operation may be accomplished by a reverse read or a forward read. It is understood that reverse read refers to applying a read bias to the drain region for reading the left bit stored near the source region or applying a read bias to the source region for reading the right bit stored near the drain region. In contrast, forward read refers to applying a read bias to the source region for reading the left bit stored near the source region or applying a read bias to the drain region for reading the right bit stored near the drain region.

Figure 8B:
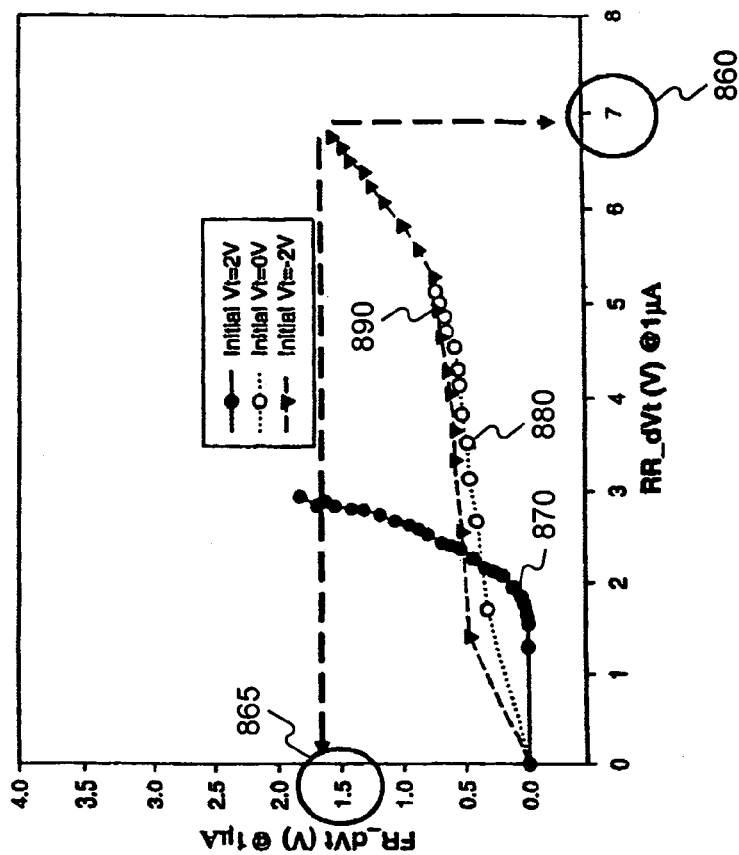
FIG. 8B illustrates a graphical representation of the relationship between the shift of the forward read threshold voltage and the shift of the reverse read threshold voltage for various initial threshold voltage levels.
Figure 8A:
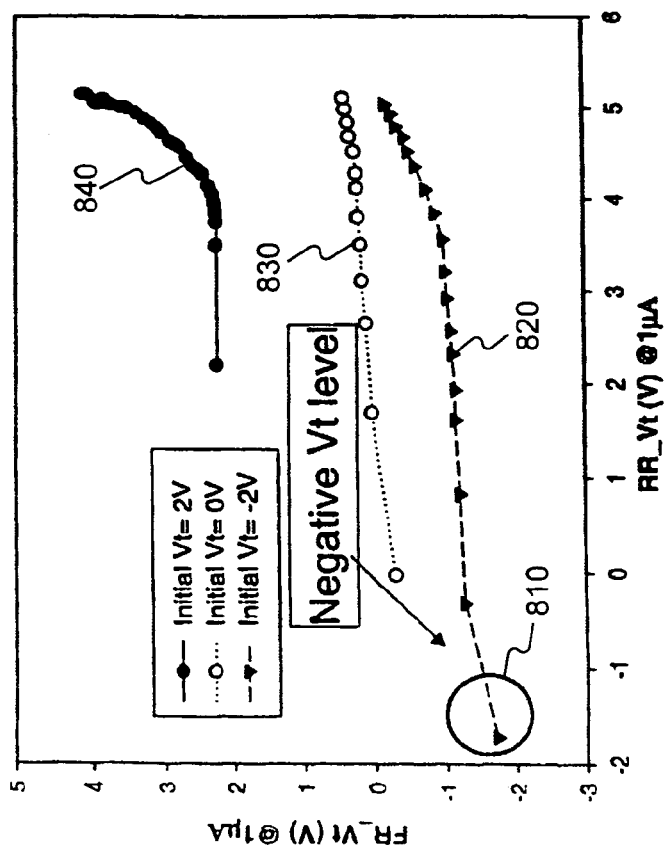
FIG. 8A illustrates a graphical representation of the relationship between the forward read threshold voltage and the reverse read threshold voltage for various initial threshold voltage levels.

As seen in FIG. 8A, the forward read threshold voltage increases with increasing reverse read threshold voltage when the initial threshold voltage of the memory cell 100 is 2 V (curve 840). As discussed above, such increased threshold voltage on one side of the trapping layer due to an increase of the threshold voltage on the other side is caused by the second bit effect. If the initial threshold voltage is set lower to 0 V (curve 830) or even negative, for example, –2 V (curve 820), the forward read threshold voltage increases little, even though the reverse read threshold voltage increases to about 5 V.

FIG. 8B illustrates a normalized plot of the data shown in FIG. 8A, in which curves 870, 880, and 890 correspond to curves 840, 830, and 820, respectively. As shown in FIG. 8B, if the initial threshold voltage is set to 2 V, the forward read threshold voltage increases more than 1.5 V when the reverse threshold voltage increases from 1 V to just under 3 V (curve 870). Again, this is due to the second bit effect. On the other hand, when the initial threshold voltage is reduced, to either 0 or preferably a negative voltage, such as –2 V, the forward read threshold voltage does not increase substantially when the reverse read threshold voltage increases. For example, for an initial threshold voltage of 0 V, the forward read voltage increases about 0.6 V over an increase of about 5 V in the reverse read threshold voltage (curve 880). In addition, when the initial threshold voltage is set to –2 V, the forward read threshold voltage increases about 1.5 V, as with curve 870, but it does so over a 7 V increase in the reverse read threshold voltage (curve 890), not a relatively small increase of just 3 V.

Generally, operation window refers to the difference between the reverse read threshold voltage and the forward read threshold voltage. It is also understood that the second bit operation window is the same as the memory window for memory devices having localized trapped charges. As shown in FIG. 8B, a memory device with a lower initial threshold voltage has a higher operation window. For example, when the initial threshold voltage is –2V, the operation window is about 5.5 V.

Memory cells, as discussed above, may be connected together to form, for example, a NAND array. FIGS. 9A-9E illustrates various cell operations applied to a portion of a NAND array 900.

Figure 9A:
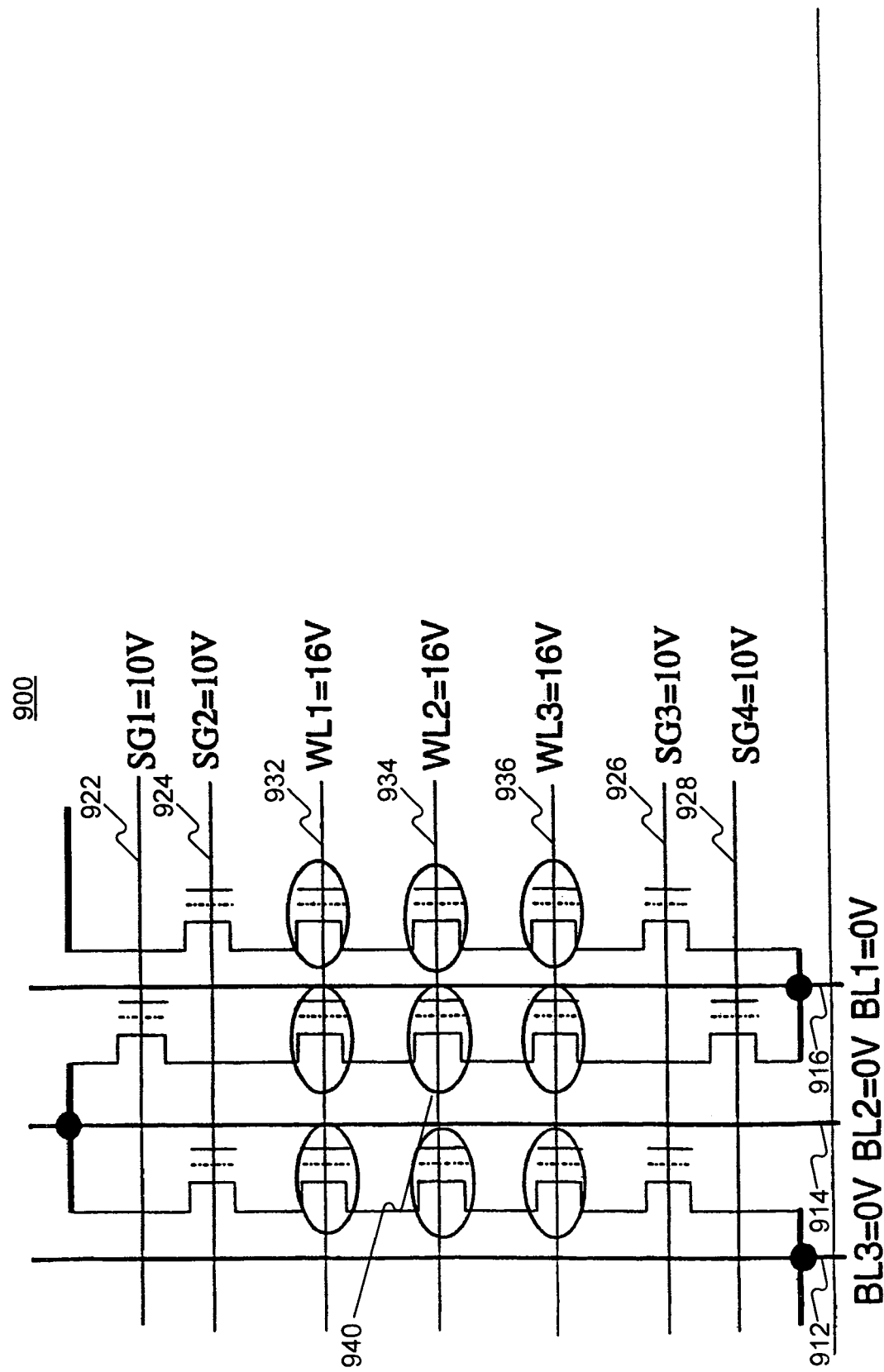
FIG. 9A is an exemplary schematic view illustrating a portion of a NAND array using a gate hole FN injection operation to reset or erase all memory cells to a negative threshold voltage level.

In FIG. 9A, the NAND array 900 uses a gate hole FN injection operation, as discussed above to reset or erase all memory cells to a negative threshold voltage level. The NAND array 900 comprises individual memory cells such as memory cell 940. The NAND array 900 includes bit lines 912, 914, and 916, word lines 932, 934, and 936, and selector gates 922, 924, 926, and 928. During a gate hole FN injection operation, a bias of 0 V is applied to the bit lines 912, 914, and 916, a bias of 16 V is applied to the word lines 932, 934, and 936, and a bias of 10 V is applied to the selector gates 922, 924, 926, and 928. This gate hole FN injection operation resets or erases all memory cells in the NAND array 900 to a negative threshold voltage level.

In FIG. 9B, a CHE injection operation is used to store charge in a portion of a nitride layer adjacent the source region of cell 940, hereinafter referred to as "bit 1." During a CHE injection operation, bit 1 may be programmed by applying appropriate biases to the bit lines, word lines, and selector gates. For example, a floating bias is applied to the bit line 912, a bias of 5 V is applied to the bit line 914 and a bias of 0 V is applied to the bit line 916. In addition, a bias of 0 V is applied to the word lines 932 and 936, a bias of 9 V is applied to the word line 934, a bias of 10 V is applied to the selector gates 922 and 928, and a bias of 0 V is applied to the selector gates 924 and 926.

In FIG. 9C, another CHE injection operation is used to store charge in a portion of a nitride layer adjacent the drain region of cell 940, hereinafter referred to as "bit 2." During a CHE injection operation, bit 2 may be programmed by applying appropriate biases to the bit lines, word lines, and selector gates. For example, a floating bias is applied to the bit line 912, a bias of 0 V is applied to the bit line 914, and a bias of 5 V is applied to the bit line 916. In addition, a bias of 0 V is applied to the word lines 932 and 936, a bias of 9 V is applied to the word line 934, a bias of 10 V is applied to the selector gates 922 and 928, and a bias of 0 V is applied to the selector gates 924 and 926.

FIG. 9D is an exemplary schematic view illustrating a portion of the NAND array 900 using a BTBHHI operation to erase bit 1 of the memory cell 940 within the NAND array 900. Bit 1 may be erased by applying appropriate biases to the bit lines, word lines, and selector gates. For example, a floating bias is applied to the bit lines 912 and 916, and a bias of 5 V is applied to the bit line 914. In addition, a bias of 0 V is applied to the word lines 932 and 936, a bias of –5 V is applied to the word line 934, a bias of 10 V is applied to the selector gate 922, and a bias of 0 V is applied to the selector gates 924, 926 and 928.

In FIG. 9E, another BTBHHI operation is used to erase bit 2 of a memory cell within the NAND array 900. Bit 2 may be erased by applying appropriate biases to the bit lines, word lines, and selector gates. For example, a floating bias is applied to the bit lines 912 and 914, and a bias of 5 V is applied to the bit line 916. In addition, a bias of 0 V is applied to the word lines 932 and 936, a bias of −5 V is applied to the word line 934, a bias of 0 V is applied to the selector gates 922, 924 and 926, and a bias of 10 V is applied to the selector gate 928.

Figure 10:
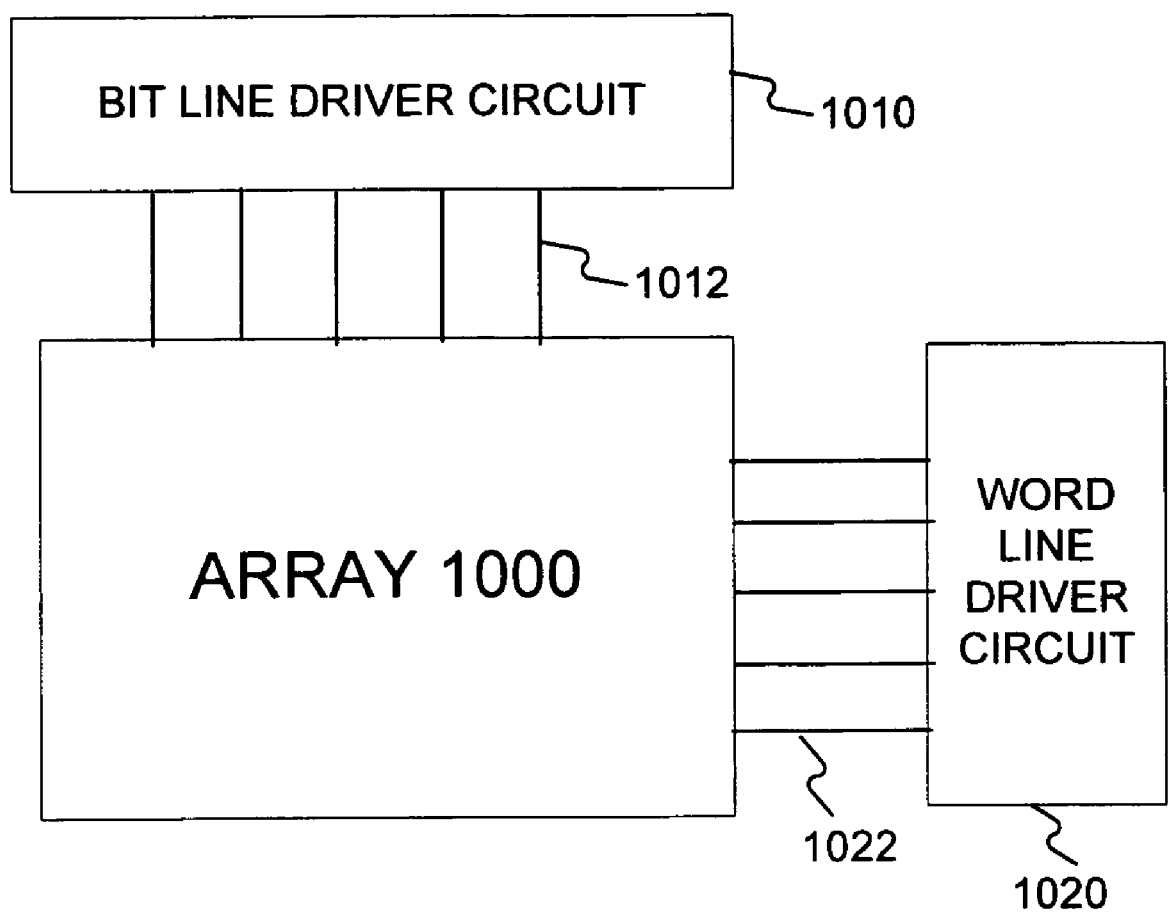
FIG. 10 shows a block diagram illustrating an array configuration comprising memory cells.

FIG. 10 shows a block diagram illustrating an array 1000 comprising memory cells. The array 1000 is connected to a bit line driver circuit 1010 via bit lines (such as 1012) and a word line driver circuit 1020 via word lines (such as 1022). The array 1000 may, for example, be the NAND array 900, as described above. Consistent with the present invention, the array 1000 may also be a NOR or JTOX array.

According, methods and devices described above reduce the second bit effect in memory cell devices. When the initial threshold voltage of the memory-cell is lowered, preferably to a negative level, it minimizes any threshold voltage increase associated with the second bit effect.

While the present invention has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor memory device, comprising:
a substrate having a first conductivity type;
a first region provided in the substrate, the first region having a second conductivity type;
a second region provided in the substrate spaced from the first region, the second region having the second conductivity type;
a channel region provided in the substrate and extending between the first and second regions;
a first insulative layer including a first material provided on the channel region;
a second insulative layer including a second material provided on the first insulative layer, the second insulative layer being configured to store a first charge in a first portion corresponding to a first bit and a second charge in a second portion corresponding to a second bit;
a third insulative layer provided on the second insulative layer;
a first conductive layer provided on the third insulative layer;
a fourth insulative layer provided on the first conductive layer; and
a second conductive layer provided on the fourth insulative layer.

2. The semiconductor memory device of claim 1, wherein:
upon application of first, second, and third biases to the first region, the second region, and the second conductive layer, respectively, the first charge is stored in the first portion of the second insulative layer, and
upon application of fourth, fifth, and sixth biases to the first region, the second region, and the second conductive layer, respectively, the second charge is stored in the second portion of the second insulative layer.

3. The semiconductor memory device of claim 1, wherein the first material comprises an oxide and the second material comprises a nitride.

4. The semiconductor memory device of claim 1, wherein the first conductivity type is P-type and the second conductivity type is N-type.

5. The semiconductor memory device of claim 1, wherein the first region is a source region and the second region is a drain region.

6. The semiconductor memory device of claim 1, wherein the second conductive layer is a gate electrode.

7. The semiconductor memory device of claim 1, wherein the third insulative layer is an oxide layer, the first conductive layer is a polysilicon layer, and the fourth insulative layer is an oxide layer.

8. The semiconductor memory device of claim 1, wherein the semiconductor memory device is configured to be implemented as part of a NAND, NOR, or JTOX array.

9. The semiconductor memory device of claim 1, wherein the first and second conductive layers and the third and fourth insulative layers are configured such that, upon application of a bias to the second conductive layer, carriers tunnel from the second conductive layer to the second insulative layer, the carriers having the same type of conductivity as majority carriers in the substrate.

10. The semiconductor memory device of claim 9, wherein the carriers comprise holes.

11. The semiconductor memory device of claim 9, wherein the semiconductor memory device has a negative initial threshold voltage.

12. A method for operating a semiconductor memory device, the semiconductor memory device comprising first and second bit lines, a gate electrode, an insulative layer, and a substrate, the method comprising:
applying first, second, and third biases to the first bit line, the second bit line, and the gate electrode, respectively, to induce carriers from the gate electrode to the insulative layer, the carriers having the same type of conductivity as majority carriers in the substrate to thereby reduce a threshold voltage of the semiconductor memory device.

13. The method of claim 12, wherein the threshold voltage has a negative value.

14. The method of claim 12, further comprising:
storing a first charge in a first portion of the insulative layer by applying fourth, fifth, and sixth biases to the first bit line, the second bit line, and the gate electrode; and
storing a second charge in a second portion of the insulative layer by applying seventh, eighth, and ninth biases to the first bit line, the second bit line, and the gate electrode.

15. The method of claim 14, wherein:
the fourth bias is greater in magnitude than the fifth bias; and
the eighth bias is greater in magnitude than the seventh bias.

16. The method of claim 12, further comprising:
applying fourth, fifth, and sixth biases to the first bit line, the second bit line, and the gate electrode;
sensing a first charge in a first portion of the insulative layer in response to the application of the fourth, fifth, and sixth biases;
applying seventh, eighth, and ninth biases to the first bit line, the second bit line, and the gate electrode; and
sensing a second charge in a second portion of the insulative layer in response to the application of the seventh, eighth, and ninth biases.

17. The method of claim 12, wherein a first charge having a first polarity is stored in a first portion of the insulative layer, and a second charge having the first polarity is stored in a second portion of the insulative layer, the method further comprising:
conducting a first erase operation of the semiconductor memory device by applying fourth, fifth, and sixth biases to the first bit line, the second bit line, and the gate electrode, respectively, to induce a third charge onto the first portion of the insulative layer, the third charge having an opposite polarity as the first charge; and conducting a second erase operation of the memory device by applying seventh, eighth, and ninth biases to the first bit line, the second bit line, and the gate electrode, respectively, to induce a fourth charge onto the second portion of the insulative layer, the fourth charge having the opposite polarity as the second charge.

18. A semiconductor memory device comprising:

a first bit line;

a second bit line;

a gate electrode;

an insulative layer;

a substrate having majority carriers, the majority carriers having a conductivity;

a first bias circuit configured to apply a first bias to the first bit line;

a second bias circuit configured to apply a second bias to the second bit line; and a third bias circuit configured to apply a third bias to the gate electrode;

wherein, upon application of the first, second, and third biases, carriers are induced from the gate electrode into the insulative layer, the carriers having said conductivity to thereby reduce a threshold voltage of the semiconductor memory device.

19. The semiconductor memory device of claim 18, wherein the first, second, and third bias circuits are further configured to apply fourth, fifth, and sixth biases to the first bit line, the second bit line, and the gate electrode, respectively, to store a first charge in a first portion of the insulative layer, and apply seventh, eighth, and ninth biases to the first bit line, the second bit line, and the gate electrode, respectively, to store a second charge in a second portion of the insulative layer.

20. The semiconductor memory device of claim 19, wherein the fourth bias is greater in magnitude than the fifth bias and the eighth bias is greater in magnitude than the seventh bias.

21. The semiconductor memory device of claim 18, wherein the insulative layer comprises a nitride.

22. The semiconductor memory device of claim 18, wherein the first conductivity type is P-type and the second conductivity type is N-type.

23. The semiconductor memory device of claim 18, wherein the carriers comprise holes.

24. The semiconductor memory device of claim 18, wherein the threshold voltage of the semiconductor memory device has an negative value.

* * * * *